United States Patent [19]

Hayakawa et al.

[11] Patent Number: 4,788,403
[45] Date of Patent: Nov. 29, 1988

[54] APPARATUS FOR AUTOMATIC SOLDERING

[75] Inventors: Futomi Hayakawa; Kazuo Onoda, both of Tokyo, Japan

[73] Assignee: Hy-Bec Corporation, Tokyo, Japan

[21] Appl. No.: 4,414

[22] Filed: Jan. 20, 1987

[30] Foreign Application Priority Data

Jan. 20, 1986 [JP] Japan ..................... 61-9628

[51] Int. Cl.$^4$ ................................. B23K 1/12
[52] U.S. Cl. ............................ 219/85 BA; 219/85 R
[58] Field of Search .......... 219/85 BM, 85 BA, 85 R, 219/85 M, 85 F, 121 LC

[56] References Cited

U.S. PATENT DOCUMENTS

| 3,632,955 | 1/1972 | Cruickshank et al. | 219/85 BA |
| 4,110,640 | 8/1978 | Ito | 219/121 LC X |
| 4,278,867 | 7/1981 | Tan | 219/121 LC X |
| 4,390,770 | 6/1983 | Kohler et al. | 219/85 F X |

FOREIGN PATENT DOCUMENTS 2038220 7/1980 United Kingdom ........... 219/85 BA

Primary Examiner—E. A. Goldberg
Assistant Examiner—C. M. Sigda
Attorney, Agent, or Firm—Young & Thompson

[57] ABSTRACT

An apparatus for the automatic soldering of lead pins distributed on a packaged IC chip in bilateral or quadrilateral parallel rows, to corresponding contact pins which are distributed on a substrate printed circuit board in rows corresponding to said rows of lead pins and have preliminarily been pasted with solder. The packaged IC chip is placed on the substrate board, and the packaged IC chip is positioned to align each lead pin in the rows on the packaged IC chip with a corresponding contact pin in the rows on the substrate board. The lead pin together with the contact pin aligned therewith is then exposed to iradiation by a heat ray emitted from a heat ray soldering head and focussed thereon as a line of focus in the form of a segment of a line corresponding to the soldering line. The apparatus comprises a memory-operation section (A), a control section (B) and an actuation section (C), wherein the control section (B) performs upon receipt of commands from the memory-operation section (A) and governs the actuation section (C), so as to move the heat ray soldering head along the x- and/or y-coordinates on the substrate board to each preset position for the packaged IC chip to be soldered and so as to effect the soldering of each spot, where an electric junction is to be built up, by the heat ray focussed as a line of focus, under programmed control.

5 Claims, 8 Drawing Sheets

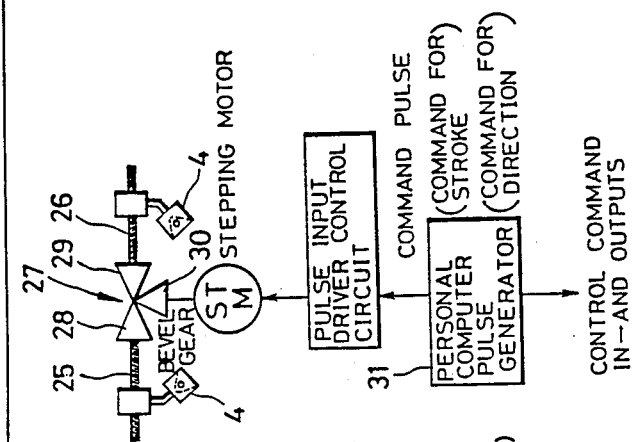
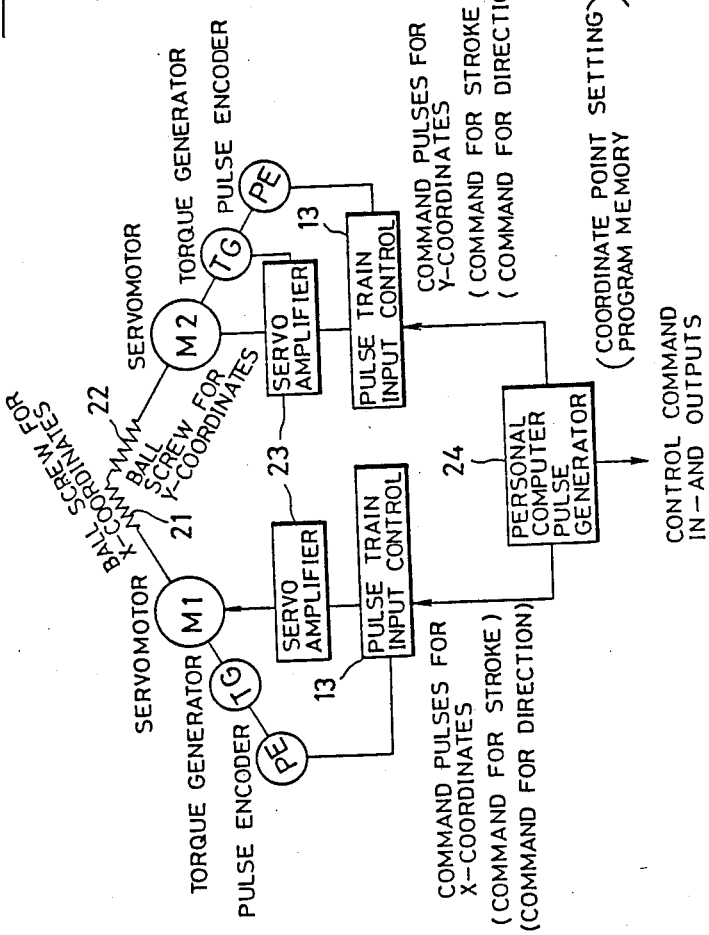

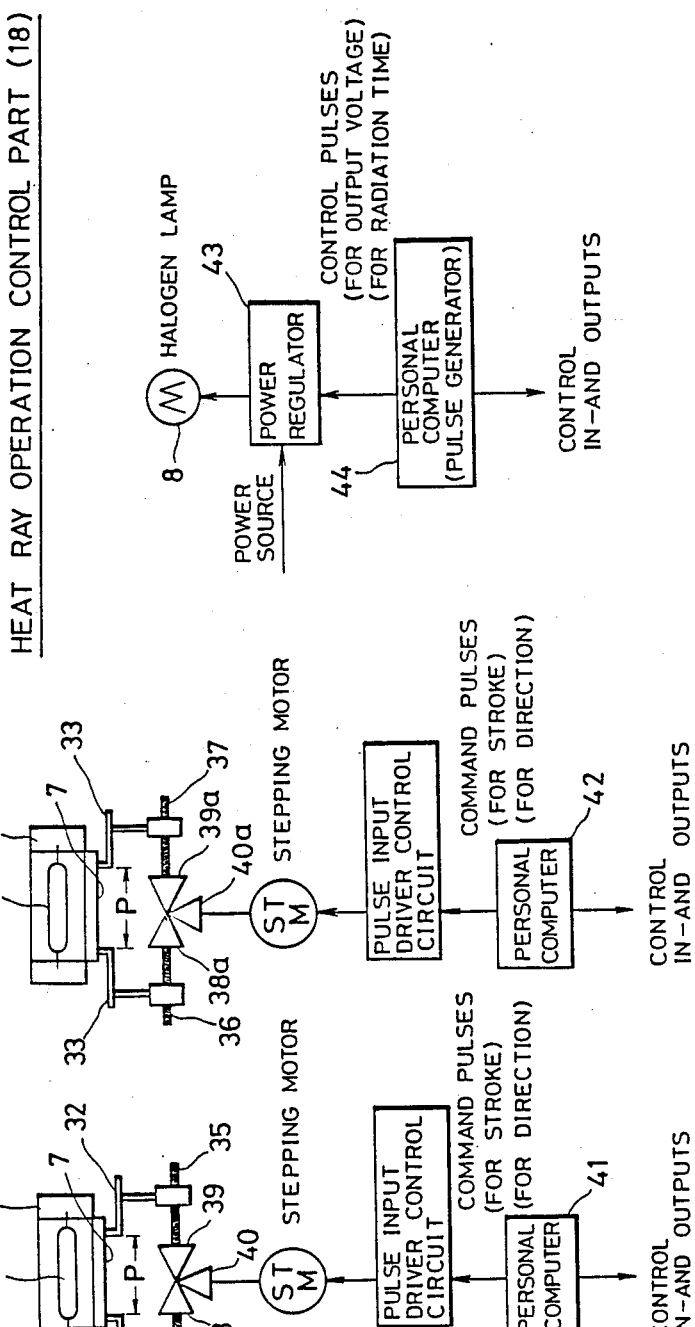
FIG. 4 (c) SHIELD MEMBER DISTANCE ADJUSTING PART (17)
FIG. 4 (d) HEAT RAY OPERATION CONTROL PART (18)

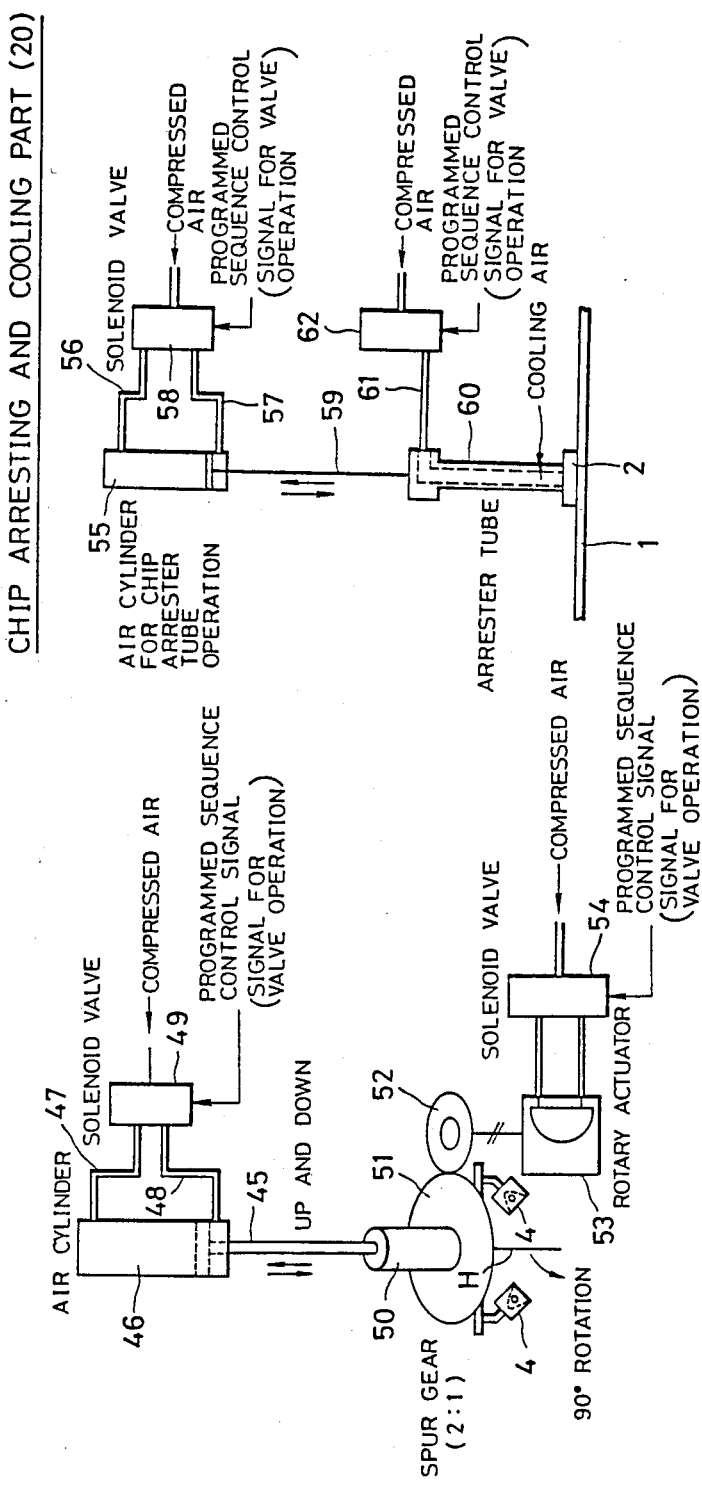

APPARATUS FOR AUTOMATIC SOLDERING

BACKGROUND OF THE INVENTION

The present invention relates to an apparatus for the automatic soldering of, for example, lead pins distributed in bilateral or quadrilateral parallel rows on a semiconductor chip, such as a packaged IC, with correspondingly distributed contact pins on a substrate plate of a printed circuit board, by heat irradiation. More particularly, the invention concerns an automatic soldering apparatus which produces at least a pair of parallel solder lines each emcompassing each of said bilateral or quadrilateral parallel rows of lead pins on a flat packaged IC, by exposing each of the lead pins to be soldered together with the contact pin pasted preliminarily with solder and aligned with said lead pin, to irradiation by a heat ray from a heat ray soldering head focussed as a line of focus in the form of a segment of a line corresponding to the soldering line, in such a manner that the adjustment and positioning of the lines of focus are effected automatically by the programmed control of mechanical actuation means that cause the heat ray soldering head to shift in the x- and/or y-coordinate direction and to turn the heat ray soldering head in the y- or x-coordinate direction on the substrate plate.

Conventional processing apparatus for mounting such a packaged IC on a substrate plate employs, for example, heating with a soldering iron, heating by a pulse heater, the so-called infrared heating reflow method, hot-air processes (Denshi-Zairyo, Materials for Electronics, 1985, No. 2, p. 37) and, as a recent proposal, laser beam heating (Keikinzoku-Yosetsu, Welding of Light Metals, Vol. 17, No. 1, 1979). These conventional techniques are accompanied by problems: for example, a small size IC package may often suffer from soldering failures, such as faulty alignment of the lead pins with the contact pins, shortcircuiting between the pins caused by excessive solder and so on, in particular when the lead pins of the IC package are densely distributed, especially for small size IC packages where the pitch or interval of the lead pins is quite small. Thus, a highly accurate printing of solder paste and a close control of work conditions, such as the mounting and positioning of the IC package on the substrate plate and so on, are required. On the other hand, due to the recent trend of employment of substrate materials of very low heat stability, such as paper, phenolic resin, etc., the substrate plate is apt to undergo thermal damage, especially when an infrared heating reflow technique, a hot-air process or laser beam heating is employed.

In the case of using laser beam heating, in which a laser beam is guided by a flexible light conduction fiber and the beam emission end thereof is moved to scan or track the soldering line by a beam scanning robot so as to focus the laser beam onto each contemplated coordinate point to effect the soldering, the beam emission head does not suffer from aging or time change by, for example, formation of a surface oxide layer etc., and thus, a stable soldering is attained, as contrasted with the case of heating by thermal conduction using for example a soldering iron etc. Here, however, an intensive irradiation by the laser beam occurs in the vicinity of the contemplated soldering spot by the diffraction of laser light, resulting in damage to the packaged IC and the substrate printed circuit board.

In particular, in the case of a packaged IC having quadrilateral rows of lead pins, there has never been proposed a processing technique in which the soldering in the directions of the x- and y-coordinates along the soldering lines is effected automatically by successive procedures.

OBJECTS OF THE INVENTION

Thus, an object of the present invention is to provide an apparatus for the automatic soldering of a workpiece, such as a packaged IC etc., by the use of a pair of heat ray beams each focussed onto the spot to be soldered, which comprises a heat ray soldering head provided with a pair of heat ray beam sources adapted to shift in the direction of the x- and/or y-coordinates and to rotate about the y- or x-coordinates.

Another object of the present invention is to provide an apparatus for the automatic soldering of a workpiece comprising a packaged IC onto a substrate plate of a printed circuit board, substantially instantaneously with high efficiency, while preventing the occurrence of faulty connections due to excessive pasting of solder and thus preventing undesirable short circuits between the lead pins or contact pins, even in the case of a packaged IC having a dense distribution of lead pins.

BRIEF SUMMARY OF THE INVENTION

According to the present invention, there is provided an apparatus for the automatic soldering of each of the lead pins of a packaged IC arranged in bilateral or quadrilateral rows, with the respective contact pins which are distributed on the substrate printed circuit board in rows corresponding to said rows of lead pins and have previously been pasted with solder. The process comprises placing said packaged IC on said substrate board, positioning said packaged IC so as to align each lead pin in each of said rows on said packaged IC with a corresponding contact pin in each of said rows on the substrate board, and exposing each lead pin together with the contact pin aligned therewith to irradiation by a heat ray emitted from a heat ray soldering head and focussed thereonto as a focussed line in the form of a segment of a line corresponding to the soldering line defined, so as to encompass one of said parallel rows of lead pins on the packaged IC aligned with the corresponding row of contact pins on the substrate board. The substrate board comprises a memory-operation section (A), a control section (B) and an actuation section (C), wherein the control section (B) provides its function responsive to the commands from the memory-operation section (A) and the section (B) controls the actuation section (C). The heat ray soldering head is moved along the x- and/or y-coordinates on the substrate board to each preset position for the packaged IC to be soldered and to effect the soldering of each spot where an electric junction is to be built up, by said heat ray beam focussed as a line, under programmed control.

In the following, the invention will further be described by way of specific embodiments shown in the accompanying drawings.

BRIEF DESCRIPTION OF THE DRAWINGS

FIGS. 4(a) to 4(f) are each an explanatory diagram explaining the essential construction of each elementary part of the apparatus according to the present invention.

DETAILED DESCRIPTION OF PREFERRED EMBODIMENTS

Figure 1:
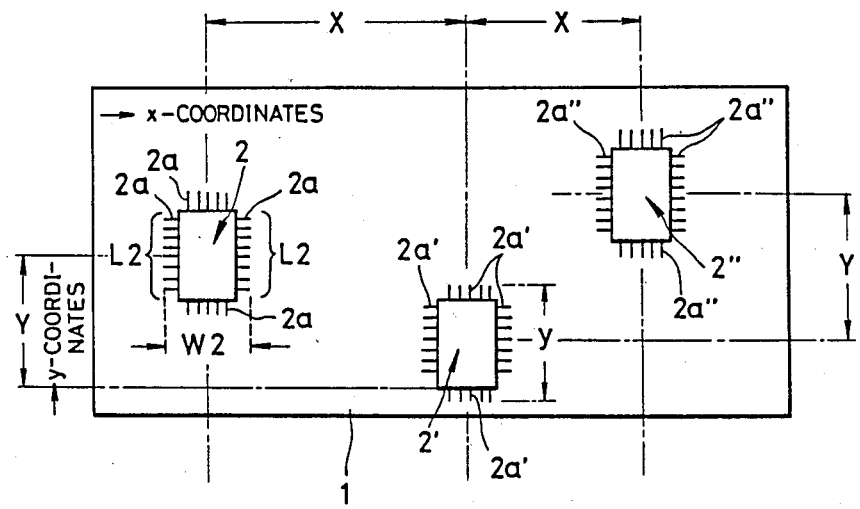
FIG. 1 depicts packaged IC chips placed on the substrate board for working by the apparatus according to the present invention, in a plan view.

In FIG. 1, three flat packaged IC chips 2, 2', 2" provided each with quadrilateral parallel rows of lead pins 2a, 2a', 2a" are placed on a substrate plate of printed circuit board 1 in predetermined positions which are displaced from each other in both directions of the x- and y-coordinates. Each lead pin in the rows of each packaged IC chip is soldered with a corresponding one of the contact pins on the substrate board, which are distributed also in parallel rows correspondingly aligned with said quadrilateral rows of lead pins, by a pair of heat ray beams from a pair of heat ray lamp units 3, 3 each having a lamp head 4. Each of the pair of lamp heads 4, 4 is supported pivotally by a pivot joint 5 and is adapted to slide toward or away from the other for adjusting the width W1 between the pair of lines of focus 6, 6. This width W1 between the pair of lines of focus is so adjusted that it coincides with the distance W1 between the pair of parallel rows of lead pins 2a extending in the direction of the x-coordinates on the flat packaged IC chip 2 shown in FIG. 1. When the rows of lead pins extending in the direction of the y-coordinates are to be soldered, the soldering head is turned 90° to the direction of the y-coordinates, so that the pair of lines of focus 6, 6 will align with said pair of rows of lead pins extending in the y-coordinate direction. This right angle turn of the soldering head is effected by a rotor 50 supported on a support plate 113 by a bearing means. The rotor 50 has a gear wheel 51 which is held in engagement with another gear wheel 52 driven by a rotary actuator 53 disposed on a support plate 113. The support plate 113 is connected to the piston rod 45 coupled to an air cylinder 46 of a pneumatic unit for effecting vertical movement.

Underneath the gear wheel 51 is arranged fixed thereto a mechanism for effecting adjustment of the width W1 between the pair of lines of focus 6, 6, which consists of two screw shafts 25 and 26 each guided rotatably in a guide member 116, 116 and threaded oppositely from each other, as shown in FIG. 4(b). On each of the screw shafts 25 and 26 is mounted a slide member 117 in engagement with the screw threads. The adjacent inner ends of the screw shafts are provided each with a bevel gear 28, 29 fixed thereto and held in engagement with another bevel gear 30 disposed at the lower end of the rotor 50 and rotated by a stepping motor, whereby the slide members 117, 117 are slid toward or away from each other, in order to adjust the width W1 between the lines of focus 6.

The length L1 of each line of focus 6 is adjusted automatically by sliding a pair of shield members 32, 32; 33, 33 arranged in the heat ray emission opening 7 of the heat ray lamp unit 4, so that it coincides with the length L2 of the row of lead pins 2a. Thus, each of the pairs of shield members 32, 32 and 33, 33 will function to effect adjustment of the length of each line of focus 6 by slidingly limiting the width of the heat ray emission opening 7 of the lamp unit 3. As the heat ray lamp 8, a halogen lamp is preferably employed. The infrared ray from the lamp 8 is focussed by a gold-plated concave mirror 9 of elliptical profile onto the soldering line to form the line of focus 6, whereby soldering of each lead pin 2a in the lead pin row on the packaged IC chip 2 with the corresponding contact pin in the contact pin row on the substrate board 1 aligned therewith is achieved instantaneously.

In order to arrest the packaged IC chip 2 placed on the substrate board 1 and to cool the chip during the soldering operation, an arrester tube 60 is provided that extends through the center of bevel gear 30. The arrester tube 60 arrests the IC chip by pressing on it and guides the cooling air onto the IC chip. Vertical movement of the arresting tube 60 is effected by means of a cylinder/piston unit 55/59.

The actuation mechanism for adjusting the distance between the pair of shield members 32, 32 or 33, 33 disposed in the heat ray emission opening 7, 7 is similar to that for the pair of lamp heads 4, 4. Thus, as suggested in FIG. 4(c), the screw shafts 34, 35 or 36, 37 are provided at their adjacent inner ends each with a bevel gear 38, 39; 38a, 39a both held in engagement with a driving bevel gear 40, 40a which is driven by a stepping motor STM.

Alternatively, it is possible also to employ a pneumatic actuation mechanism for effecting the sliding adjustment of the distance between the pair of shield members 32, 32; 33, 33. Thus, as indicated in FIG. 2(b), a pair of heat ray lamp units 3, 3 are fixed each to an arm 100 by connection pins 5, 5. Each arm 100 is fixed to a slide member 101 guided on a pair of guide rods 102, 102 so as to effect sliding movement thereon by means of an air cylinder 103 and a piston rod 104 coupled therewith (in FIG. 2(b), only the left hand half thereof is shown). The air cylinder 103 is connected to a pneumatic actuation valve means through connection pipes 105, 106 to actuate the cylinder/piston unit 103, 104. The piston rod 104 is connected to a slide member 101 (the left slide member in FIG. 2(b)) through a connection plate 108 via a terminal member 107. The other slide member (the right slide member in FIG. 2(b)) has the same structure and thus is not shown in this figure. By sliding the pair of lamp units 3, 3 using this mechanism, the width W between the pair of lines of focus 6, 6 is adjusted. This width W is made to coincide with the distance "W" between the pair of rows of lead pins 2a, 2a both of which extend in the x-coordinate direction on the flat packaged IC chip 2 shown in FIG. 1.

The right angle turning of the pair of lines of focus 6, 6 to the direction of the y-coordinates is achieved by turning the pair of lamp heads 4, 4 at a right angle using the rotor 50, as explained previously. The rotation of the rotor 50 is effected by means of a rotary actuator 111 via a driving belt 110. The support plate 113 supporting the rotor 50 rotatably by a bearing means is connected to the piston rod 45 coupled with the air cylinder 46 for the vertical movement of the lamp units.

Explaining now the manner of adjustment of the length of line of focus 6 with reference to FIG. 2(c), the length of line of focus 6 will be small, when the free space or width between the pair of shield members 32, 32 is narrow, and will be large, on the contrary, when this free space is wide. The sliding movement of the pair of shield members 32, 32; 33, 33 is effected all at once by means of a pair of flexible wire actuation means 117a, 117a. The pairs of flexible wires 117a, 117a are actuated by a pair of shield member adjusting cylinder units 118, 118, whereby the sliding movements of the pairs of shield members 32, 32 and 33, 33 are attained simultaneously.

Figure 3:
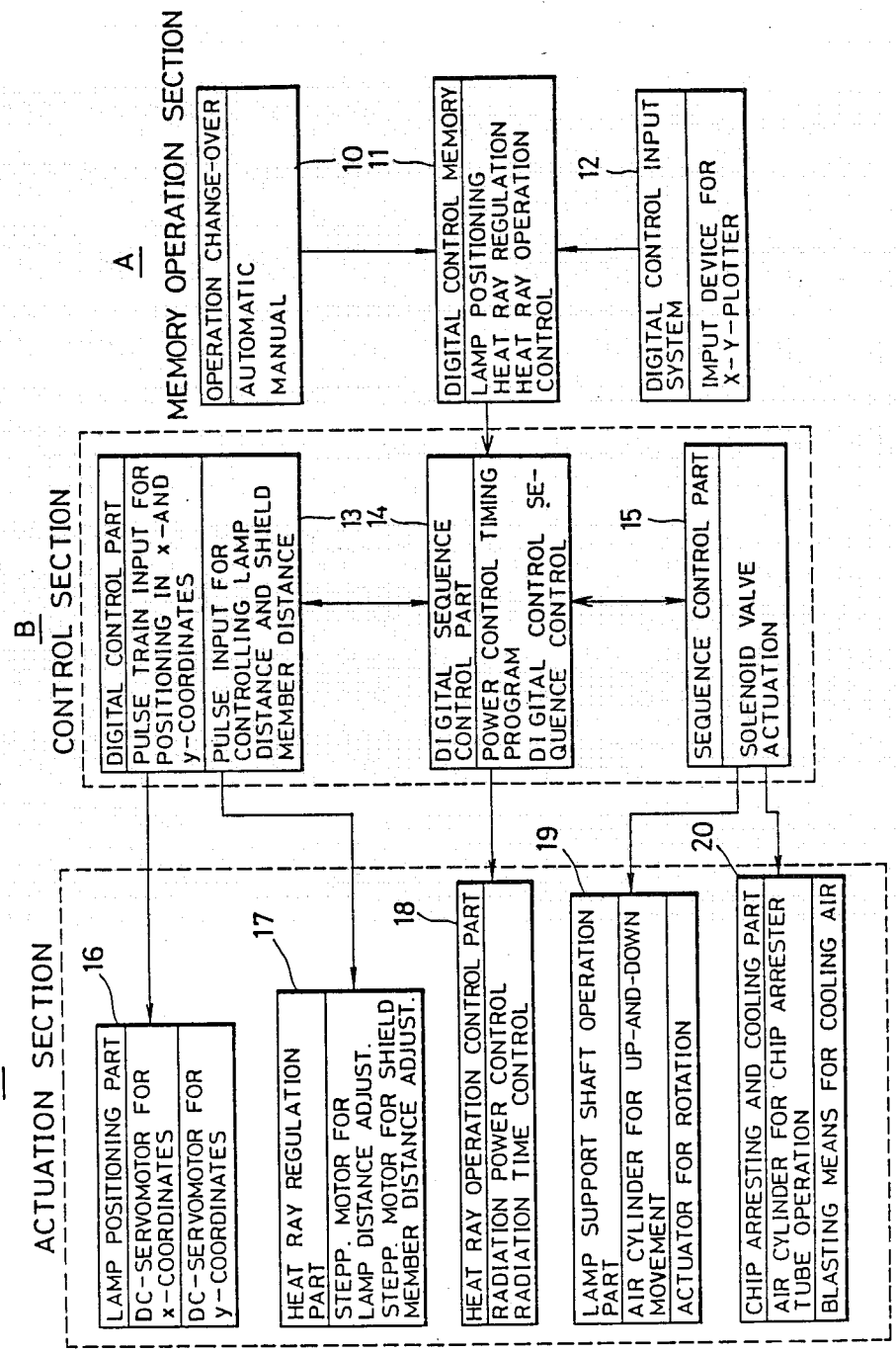
FIG. 3 is an operation control system block diagram for the apparatus according to the present invention.

The operation control system of the apparatus according to the present invention is as shown in FIG. 3. The apparatus according to the present invention is constituted of a memory-operation section (A), a control section (B) and an actuation section (C). The memory-operation section (A) includes an operation changeover part 10, a digital control memory part 11 and a digital control input system part 12. The operation changeover part 10 comprises a means for changing over the mode of operation of the apparatus from automatic to manual and vice versa. The digital control memory part 11 performs the function of positioning the pair of heat ray lamp units 3, 3, adjusting the length of the line of focus of the heat ray, and the control of the heating conditions. The digital control input system part 12 comprises input units, for example for the x-y-plotter for the pair of heat ray lamp units 3, 3, for example, an x-y-positioning mechanism; a means for effecting turning of the heat ray lamp units; a means for adjusting the length of the line of focus; and all other actuation means for realizing the positioning, adjustment and so on of different sized IC chips under programmed control. It is of course possible to construct the digital control input system part 12 as a partial unit in an automation line which cooperates with a mechanism for automatic transportation of IC chips, a device for positioning the IC chips and so on.

The operation changeover part 10 is connected with the digital control memory part 11 which in turn is connected to the digital/sequence control part 14 in the control section (B).

The control section (B) includes a digital control circuit part 13, a digital/sequence control circuit part 14 and a sequence control circuit part 15. The digital control part 13 performs the function of controlling the position of the pair of heat ray lamp units 3, 3 by shifting them in the direction of the x- and/or y-coordinates by the pulse train input control as well as effecting control of the adjustment of the distance between the pair of heat ray lamp units 3, 3 and of the gap between the pairs of shield members 32, 32; 33, 33. The digital/sequence control part 14 performs the function of controlling the output power of the heat ray lamp, the adjustment of heating duration and so on by a timing program. The sequence control part 15 performs the function of controlling the right angle turning of the pair of lamp units 3, 3, vertical movement of the arrester tube 60 and actuation of the solenoid valve for controlling the cooling air supply to the tube 60. The digital control part 13, the digital/sequence control part 14 and the sequence control part 15 are connected with each other.

The actuation section (C) includes a lamp positioning part 16, a heat ray regulation part 17, a heat ray operation control part 18, a lamp support shaft operation part 19 and a chip arresting and cooling part 20. The lame positioning part 16 and the heat ray regulation part 17 receive commands from the digital control part 13. The lamp positioning part 16 controls the DC servomotors for the x-and y-coordinates. The heat ray regulation part 17 governs the stepping motors STM for the lamp distance adjustment and for the shield member distance adjustment. The heat ray operation control part 18 receives output signals of the digital/sequence control part 14, in order to effect control of the adjustment of the output power of the lamp, heating duration and so on. The lamp support shaft operation part 19 and the chip arresting and cooling part 20 receive commands from the sequence control part 15. The lamp support shaft operation part 19 performs the function of controlling the air cylinder 46 for vertical movement of the lamp head and controlling the actuator 53 for right angle turning of the lamp head pair. The chip arresting and cooling part 20 performs the function of controlling the air cylinder for vertical movement of the arresting tube and controlling the blowing of the cooling air.

In the following will be explained each function of the control parts in the actuation section (C) with reference to FIGS. 4(a) to 4(e).

FIG. 4(a) shows the essential functions and mechanism of the lamp positioning part 16. The lamp positioning part 16 controls the shifting of the pair of heat ray lamp units 3, 3 as a whole in the directions of the x- and/or y-coordinates, as shown in FIG. 1, by means of a screw 21 for the x-coordinates and a screw 22 for the y-coordinates. The screw shaft 21 is driven by a servomotor M1 for the x-coordinates, which is connected to the pulse train input control circuit for the x-coordinates in the digital control part 13 via a torque generator TG and a pulse encoder PE. This input control circuit is connected to said servomotor M1 via a servo-amplifier 23. The pulse train input control circuit for the x-coordinates receives the command pulses for the x-coordinates, such as commands for the stroke and for the direction of shifting and so on, from a personal computer pulse generator 24 in the digital/sequence control part 14.

The screw shaft 22 for the y-coordinates is driven by a DC servomotor M2 which is connected to the pulse train input control circuit for the y-coordinates in the digital control part 13 via a torque generator TG and a pulse encoder PE. The pulse train input control circuit for the y-coordinates is connected through a servo-amplifier 24 to the servomotor M2 and the torque generator TG mentioned above. The pulse train input control circuit for the y-coordinates receives from the personal computer pulse generator 24 in the digital/sequence control part 14 command pulses for the y-coordinates, such as a command for shifting the stroke and a command for shifting the direction. The pulse generator 24 receives the commands for lamp head positioning (program memory for the x- and y-coordinates) of the digital control memory part 11.

FIG. 4(b) depicts the fundamental function and construction of the heat ray regulation part 17. The left side lamp head 4 of the pair of heat ray lamp units 3, 3 and the right side lamp head 4 thereof are moved by means of a screw 25 for the left side lamp head and a screw 26 for the right side lamp head respectively, so as to approach to or recede from each other. The shafts of screws 25 and 26 are driven by a bevel gear arrangement 27 in such a manner that the screw 25 and the screw 26 are driven by the bevel gears 28 and 29 respectively, which are held in engagement with a bevel gear 30 driven by a stepping motor STM. The stepping motor STM receives commands from the pulse input driver control circuit for controlling the lamp distance and the shield member distance in the control part 13. The pulse input driver control circuit receives command pulses from the personal computer pulse generator 31 of the digital/sequence control part 14, for example, for the stroke and direction of sliding of the slide members. The personal computer pulse generator 31 receives the outputs of the digital control memory part 11.

Figure 2:
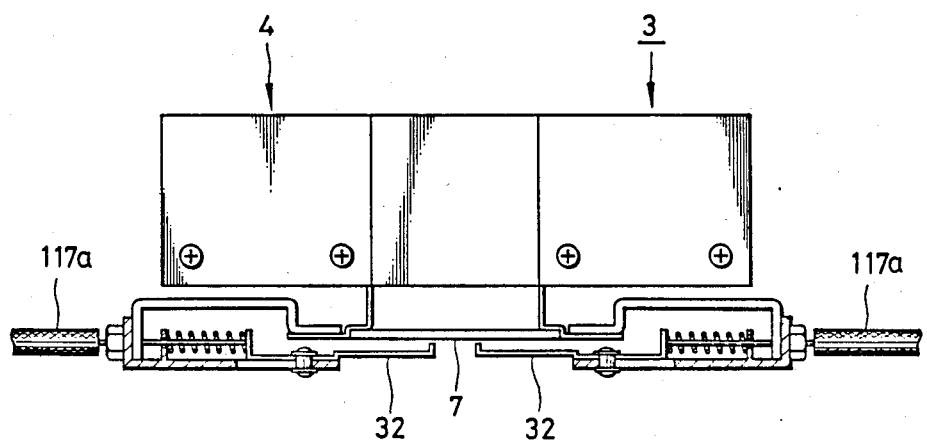
FIGS. 2(a) and 2(b) show each a different embodiment of the heat ray soldering head according to the present invention, each in a front view.
FIG. 2(c) is a vertical section of an embodiment of the heat ray beam restriction system.
Figure 2:
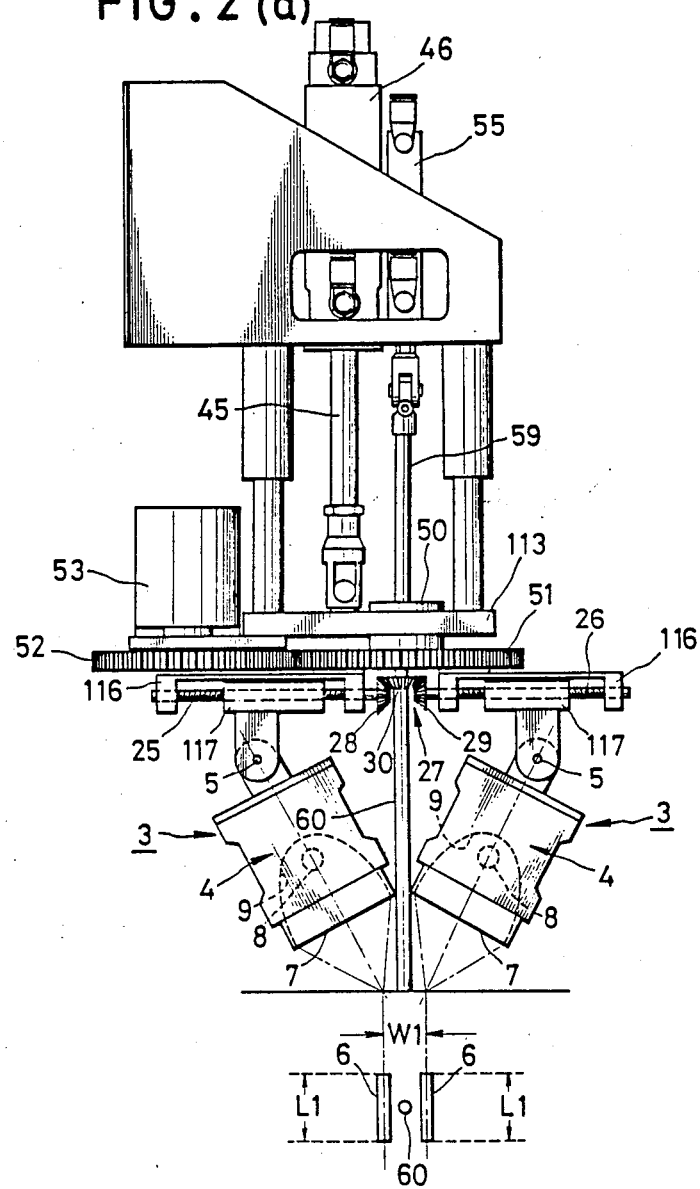
Figure 2:
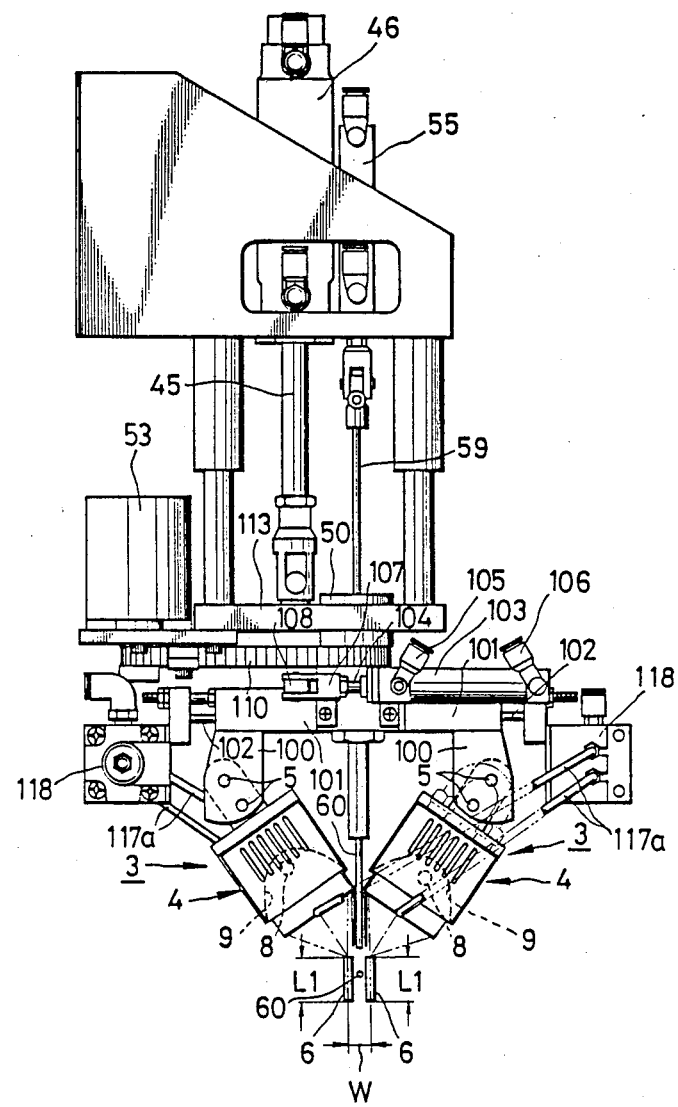

In FIG. 4(c), the heat ray regulation part 17 for automatically regulating the length L1 of the line of focus 6 is illustrated. As is seen from this figure, each heat ray emission opening 7 for the pair of heat ray lamp heads 4, 4 is provided with a pair of slidable shield members 32, 32 or 33, 33. By sliding adjustment of the distance between the pair of shield members 32, 32 or 33, 33, the width P of the heat ray emission opening is determined, so as to impart to each heat ray a desired length of line of focus 6. The shield members 32, 32 and 33, 33 are slid by means of a pair of screw shafts 34, 35 and 36, 37. The screw shafts 34 and 35 are driven each by a bevel gear 38 or 39 both of which are driven by a bevel gear 40. The bevel gear 40 is driven by a stepping motor STM which is controlled by the output command pulse of the pulse input driver control circuit which receives command pulses, such as, commands for stroke and for direction etc., from the personal computer pulse generator 41 in the digital/sequence control part 14. The personal computer 41 receives the outputs of the digital control memory part 11. The other lamp head has the same construction as above. By supplying the same output from the digital control memory part 11 to the personal computers 41 and 42, the two pairs of shield members 32, 32 and 33, 33 are slid the same distance simultaneously so as to build up a pair of congruent line foci 6, 6, as shown in FIG. 2.

In FIG. 4(d), the heat ray operation control part 18 for governing the halogen lamp 8 is explained. The operation of the halogen lamp 8 is controlled by an output power regulator 43 connected to the power source. The power regulator receives from a personal computer pulse generator 44 in the digital/sequence control part 14 control pulses, such as, for the output voltage, heating duration and so on. The personal computer 44 receives commands from the digital control memory part 11.

FIG. 4(e) explains the lamp support shaft operation part 19 for operating the lamp heads 4, 4 for vertical movement and for right angle turning. The piston rod 45 moves the lamp heads 4, 4 toward or away from the workpiece by actuation of an air cylinder 46 of a pneumatic actuator unit. The air cylinder 46 is operated by a solenoid valve 49 of which two operation pipes 47 and 48 are connected to the upper and lower ends of the cylinder 46. The solenoid valve 49 is connected to a source of compressed air (not shown) and is governed by valve operation command signals from the sequence control part 14, whereby the vertical movement of the piston rod 45 is controlled by the pneumatic control of the air cylinder 46. For effecting right angle turning of the pair of lamp heads 4,4 around the axis of the piston rod 45, there is provided a rotor 50 supported by bearing means. The piston rod 45 passes freely rotatably through the rotor 50. The rotor 50 is provided at its lower end with a spur gear 51 fixed thereto which is connected with the lamp heads 4, 4 and is held in engagement with a driving gear wheel 52 driven by a rotary actuator 53 which is connected to a solenoid valve 54 and is subjected to the valve operation signal from the sequence control part 15, whereby the rotary actuator 53 is put in operation so as to rotate the spur gear 51 via the driving gear wheel 52 to effect right angle turning of the pair of lamp heads 4, 4.

FIG. 4(f) explains the fundamental construction and function of the chip arresting and cooling part 20. The chip arresting and cooling part 20 has a pneumatically actuated air cylinder 55 connected to the solenoid valve 58 through two operation pipes 56, 57. The solenoid valve 58 is connected to a compressed air source (not shown) and is subject to the command pulses for controlling the valve operation from the sequence control part 15. By the pneumatic actuation of the air cylinder 55 by the solenoid valve 28, the piston rod 59 is vertically moved, in order thus to arrest or release the workpiece by or from the arrester tube 60 disposed at the free end of the piston rod. The arrester tube 60 is connected to a cooling air source (not shown) via conduit 61 and a controlling solenoid valve 62 and has also the role of guiding and blowing the cooling air onto the chip being soldered for cooling it, under the control of actuation signals for the valve operation coming from the sequence control part 15.

Figure 5:
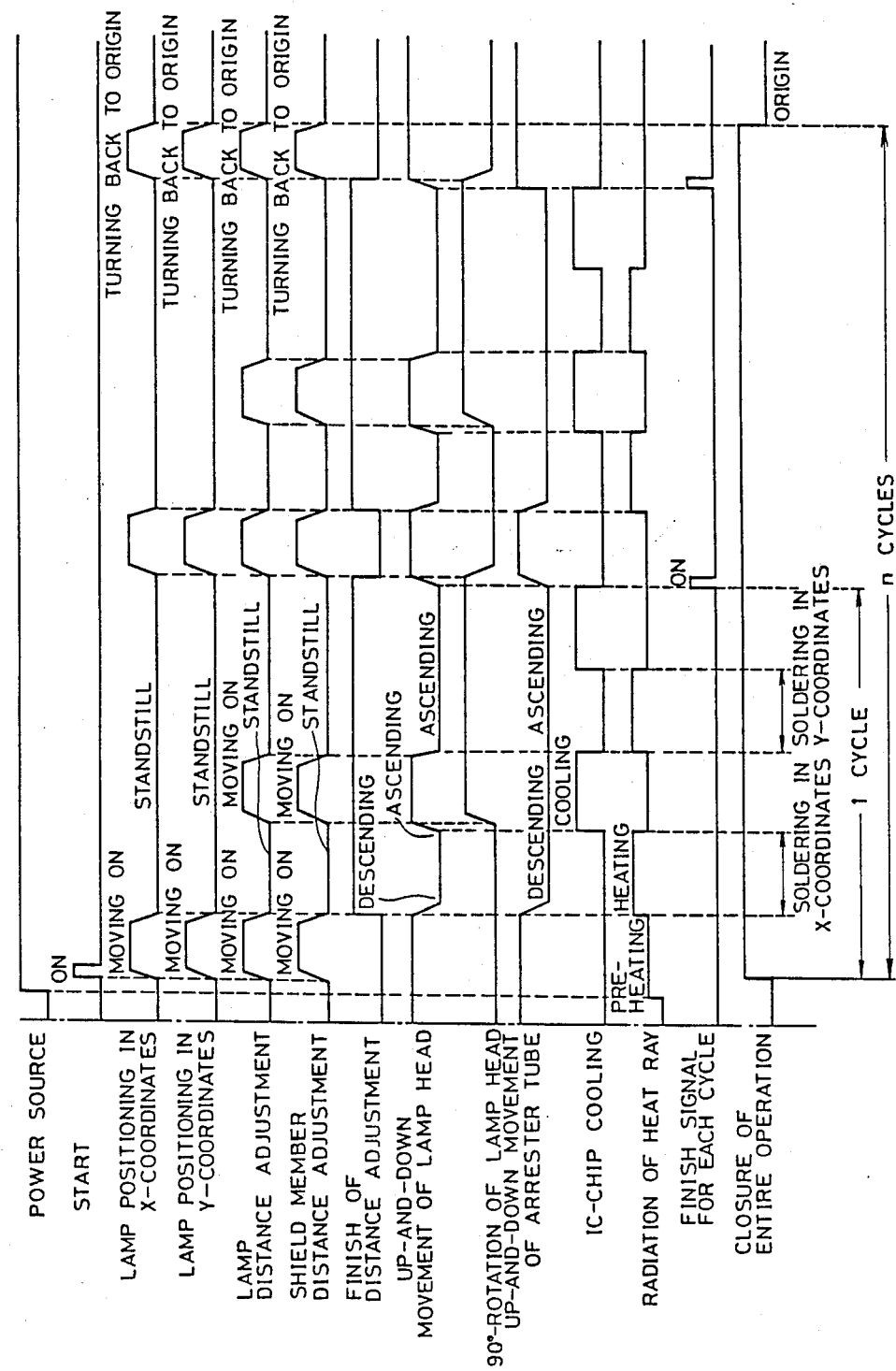
FIG. 5 is an operation sequence diagram for the apparatus according to the present invention.

FIG. 5 is a fundamental operation timing chart of the apparatus according to the present invention. In the following, the time sequence of each operation of the apparatus according to the present invention is described for the case of the successive soldering of packaged IC chips 2, 2', 2" having each two pairs of parallel rows of lead pins 2a, 2a', 2a" arranged quadrilaterally on each IC chip placed on a substrate board 1 as shown in FIG. 1.

Upon starting the apparatus according to the present invention by switching on the power source, the soldering head of the apparatus is first moved to the soldering position of the first packaged IC chip 2 on the substrate board 1 by a programmed choice of the x- and y-coordinates thereof and is stopped there. The movement of the soldering head in the direction of the x-coordinates on the substrate board 1 is effected by a servomotor M1 under the control of the command signals from the lamp positioning control circuit in the digital control memory 11 through the digital/sequence control part 14 via the pulse train input control circuit for the x-coordinates in the digital control part 13 and via the servo-amplifier 23. Thus, the screw shaft 21 is rotated by the servomotor M1 and the soldering head, and thus, the pair of heat ray lamp units 3, 3 are moved in the direction of the x-coordinates a distance corresponding to the number of pulses of the command. In the same way, the shifting of the soldering head in the direction of the y-coordinates is caused by the servomotor M2 under the control of the command from the lamp positioning control circuit in the digital control memory 11 through the digital/sequence control part 14 via pulse train input control circuit for the y-coordinates in the digital control part 13 and via servo-amplifier 24. Thus, the screw shaft 22 for the y-coordinates is rotated by the servomotor M2 and the soldering head is shifted together with the pair of heat ray lamp units 3, 3 in the direction of the y-coordinates by a stroke corresponding to the number of pulses of the command. In this manner, the pair of lamp heads 4, 4 will be set at the proper soldering position of the first IC package 2 on the substrate board 1.

The adjustment of the width W between the pair of rows of lead pins 2a, 2a to coincide with the distance between the pair of lines of focus 6, 6 is effected by the actuation system shown in FIG. 4(b). Thus, the stepping motor STM for adjusting the lamp head distance in the heat ray regulation part 17 is controlled by the command pulses from the pulse input driver control circuit for the lamp distance in the digital control part 13.

Thereby the rotation of the screw shafts 25, 26 by the bevel gear arrangement 27 is controlled so as to make the width "W" between the pair of lamp heads 4, 4 coincide with the distance between the pair of parallel rows of lead pins on the IC chip.

For the control of the distance between the pair of line focuses 6, 6 of the heat rays from the pair of lamp heads 4, 4, such that the length thereof coincides with that of the pair of parallel rows of lead pins 2a, 2a on the IC chip, the system as shown in FIG. 4(c) is used. Thus, the stepping motors STM in the heat ray regulation part 17 are operated simultaneously on receipt of the command pulses from the pulse input driver control circuit in the digital control part 13 for controlling, for example, the sliding stroke and the sliding direction, whereby the bevel gears 40 and 40a are driven simultaneously to rotate the pairs of bevel gears 38, 39 and 38a, 39a, so as to slide the pairs of the shield members 32, 32 and 33, 33 simultaneously via the screws 34, 35; 36, 37 to restrict the width of each irradiation opening 7 to a proper value. Both the heat ray lamps 8, 8 are subject to the command pulses supplied to the heat ray operation control part 18 from the digital/sequence control part 14 and the lamps are lit for preheating, in order to ready the IC chip for proper soldering. Then, the lamp head supporting shaft 45 is lowered so as to cause the pair of lines of focus 6, 6 to coincide with the pair of parallel rows of lead pins 2a, 2a by operating the lamp support shaft operation part 19, as shown in FIG. 4(e). The piston rod (lamp head supporting shaft) 45 is lowered by the actuation of the air cylinder 46 by the command for the operation of the solenoid valve from the sequence control part 15 until the pair of lines of focus 6, 6 of the heat ray from the lamps 8, 8 come to coincide with the pair of parallel rows of lead pins 2a, 2a extending in the direction of the y-coordinates. At the same time, the piston rod coupled to the air cylinder 55 is lowered by the actuation of the air cylinder 55 under the control of command pulses for the operation of solenoid valve 58 supplied from the sequence control part 15, until the arrester tube 60 connected thereto presses against the packaged IC chip 2. Subsequently, the voltage of the heat ray lamps 8, 8 is raised sharply so as to effect the soldering in the direction of the y-coordinates instantaneously. After termination of the soldering, the heat ray lamps 8, 8 are turned back again to the state of preheating and the arrester tube 60 is raised. During the soldering, cooling air is supplied through the arrester tube 60 under the control of the command for the operation of solenoid valve 62 from the sequence control part 15, in order to cool the packaged IC chip 2 by blasting cooling air onto it. In this manner, soldering in the direction of the y-coordinates is effected instantaneously with high accuracy.

For carrying out the soldering in the direction of the x-coordinates, the pair of lamp heads 4, 4 are turned at a right angle at the position of said soldering in the direction of the y-coordinates by means of the operation system shown in FIG. 4(e). Upon the command from the pulse train input positioning control circuit for the x-coordinates in the control section (B), the solenoid valve 54 is actuated so as to effect rotation of the gear wheel 52 by means of the rotary actuator 53 to cause turning of the rotor 50 at a right angle by the spur gear 51, in order thus to set the pair of heat ray lamp heads 4, 4 at said position. Thus, the pair of heat ray lamp heads 4, 4 are turned through 90° so as to align the pair of lines of focus 6, 6 with the parallel rows of lead pins extending in the direction of the x-coordinates. Other operations are the same as explained previously, except that said turning movement is performed while the packaged IC chip 2 is held arrested by the arrester tube 60. After the soldering in the direction of the x-coordinates has been effected as above and the packaged IC chip 2 has been cooled by the cooling air, the air cylinder 55 is actuated so as to raise the piston rod, and thus, the arrester tube 60, thereby completing one cycle of soldering operations. Then, the soldering head is shifted to the second soldering position by shifting the soldering head along the x- and y-coordinates as explained previously. In this manner, the pair of soldering heads are further moved to the subsequent soldering positions in succession to perform similar soldering operations in x- and/or y-coordinate direction.

While the description has been directed to the processing of packaged IC chips having quadrilateral parallel rows of lead pins, IC chips having bilateral parallel rows of lead pins can be soldered in the same manner by omitting the right angle turning of the lamp heads. The soldering sequence can be reversed, namely, for example, by soldering first in the x-direction followed by the soldering in the y-direction and vice versa. Also, the order of operations in the operation cycle can be varied voluntarily so as to select the optimum work conditions.

By the apparatus according to the present invention, which is characterized by the employment of a memory-operation section (A), a control section (B) and an actuation section (C), wherein the control section (B) provides its function under subordination to the command from the memory-operation section (A) and the control section (B) governs the actuation section (C), so as to move the heat ray soldering head in the direction of the x-and/or y-coordinates on the substrate board to each preset position for the packaged IC to be worked on and so as to effect the soldering of each spot for establishing an electric junction by said heat ray focussed as a line of focus, it is made possible that the soldering operation for soldering packaged IC chips having bilateral or quadrilateral parallel rows of lead pins on a substrate printed circuit board can be achieved instantaneously with high efficiency even for a packaged IC chip with a highly dense distribution of the lead pins without suffering from junction failures, while at the same time preventing shortcircuiting due to bridge formation by a spilling out of the solder.

What is claimed is:

1. An apparatus for the automatic soldering if lead pins distributed on a package IC chip in quadrilateral rows with corresponding contact pins, which are distributed on a substrate printed circuit board in rows corresponding to said rows of lead pins and have previously been pasted with solder, comprising a heat ray soldering head for focusing in a said row of pins a line of focus in the form of a segment of a line corresponding to a soldering line, a memory-operated section (A), a control section (B) and an actuation section (C), the control section (B) operating in response to commands from the memory-operation section (A) and controlling the actuation section (C) to actuate means to move the heat ray soldering head along x coordinates on the substrate board to a position for the package IC chip to be soldered and to effect soldering along a said row where electric junctions are to be built up by said focussed heat ray and also to actuate means then to rotate said head 90° and move said head along y coordinates on the substrate board to effect soldering along another said row at right angles to said focussed-on row of pins.

2. An apparatus for the automatic soldering of lead pins distributed on a packaged IC chip in spaced parallel rows with corresponding contact pins, which are distributed on a substrate printed circuit board in rows corresponding to said rows of lead pins and have previously been pasted with solder, comprising a pair of heat ray soldering heads for focussing on two parallel said rows of pins two parallel lines of focus each in the form of a segment of a line corresponding to a soldering line, a memory-operation section (A), a control section (B) and an actuation section (C), the control section (B) operating in response to commands from the memory-operation section (A) and controlling the actuation section (C) to actuate means to move the heat ray soldering heads relative to each other such that the distance between said lines of focus is adjusted to be equal to the distance between said spaced parallel rows and said lines of focus overlie said rows for the packaged IC chip to be soldered and to effect soldering along said spaced parallel rows where electric junctions are to be built up by said focussed heat rays.

3. An apparatus for the automatic soldering of lead pins distributed on a packaged IC chip in bilateral or quadrilateral parallel rows with corresponding contact pins, which are distributed on a substrate printed circuit board in rows corresponding to said rows of lead pins and have previously been pasted with solder, comprising a heat ray soldering head for focussing on a said row of pins a line of focus in the form of a segment of a line corresponding to a soldering line,, an adjustable shield for varying the length of said line of focus, a memory-operation section (A), a control section (B) and an actuation section (C), the control section (B) operating in response to commands from the memory-operation section (A) and controlling the actuation section (C) to actuate means to move the heat ray soldering head over the substrate board to each position for the packaged IC chip to be soldered along a said row and to actuate means to adjust the shield to alter the length of said line of focus so that said line of focus is only coextensive in length with the said row to be soldered and to effect soldering along said row where electric junctions are to be built up by said focussed heat ray.

4. An apparatus for the automatic soldering of lead pins distributed on a packaged IC chip in bilateral or quadrilateral parallel rows with corresponding contact pins, which are distributed on a substrate printed circuit board in rows corresponding to said rows of lead pins and have previously been pasted with solder, comprising a heat ray soldering head for focussing on a said row of pins a line of focus in the form of a segment of a line corresponding to a soldering line, arresting means movable toward a chip to be soldered to press the chip against the board during soldering and thereafter movable away from the chip, a memory-operation section (A), a control section (B) and an actuation section (C), the control section (B) operating in response to commands from the memory-operation section (A) and controlling the actuation section (C) to actuate means to move the heat ray soldering head over the substrate board to each position for the packaged IC chip to be soldered and to actuate means to move said arresting means toward and into contact with the chip and to effect the soldering along said row where electric junctions are to be built up by said focussed heat ray and thereafter to actuate means to move said arresting means away from the chip.

5. An apparatus as claimed in claim 4, in which said arresting means is a tube that moves lengthwise toward and away from the chip, and means for supplying a cooling gas through the tube to cool the chip.

* * * * *